(12) United States Patent
Noguchi

(10) Patent No.: US 6,649,980 B2
(45) Date of Patent: Nov. 18, 2003

(54) SEMICONDUCTOR DEVICE WITH MOS TRANSISTORS SHARING ELECTRODE

(75) Inventor: Takashi Noguchi, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 10/014,105

(22) Filed: Dec. 11, 2001

(65) Prior Publication Data

US 2002/0142571 A1 Oct. 3, 2002

(30) Foreign Application Priority Data

Dec. 11, 2000 (JP) .................................... P2000-375994

(51) Int. Cl.[7] .............................................. H01L 27/01
(52) U.S. Cl. ........................ 257/351; 257/407; 438/154
(58) Field of Search ................... 438/197, 199, 438/213, 275, 279, 280, 293, 308, 585, 592, 149, 151, 154; 257/288, 347, 350, 351, 364, 368, 369, 392, 393, 401, 402, 407

(56) References Cited

U.S. PATENT DOCUMENTS 4,997,785 A * 3/1991 Pfiester ...................... 438/153
6,252,283 B1 * 6/2001 Gardner et al. ............. 257/407

* cited by examiner

*Primary Examiner*—Evan Pert
(74) *Attorney, Agent, or Firm*—Sonnenschein, Nath & Rosenthal LLP

(57) ABSTRACT

A semiconductor device including: a gate electrode made from silicon-germanium or germanium; a first semiconductor region formed under the gate electrode with a first gate insulating film between the first semiconductor region and the gate electrode; and a second semiconductor region formed over the gate electrode with a second gate insulating film between the second semiconductor region and the gate electrode, wherein a first conductivity type MOS transistor includes the first semiconductor region, the first gate insulating film, and the gate electrode, and a second conductivity type MOS transistor includes the second semiconductor region, the second gate insulating film, and the gate electrode.

14 Claims, 9 Drawing Sheets

F I G. 4 A
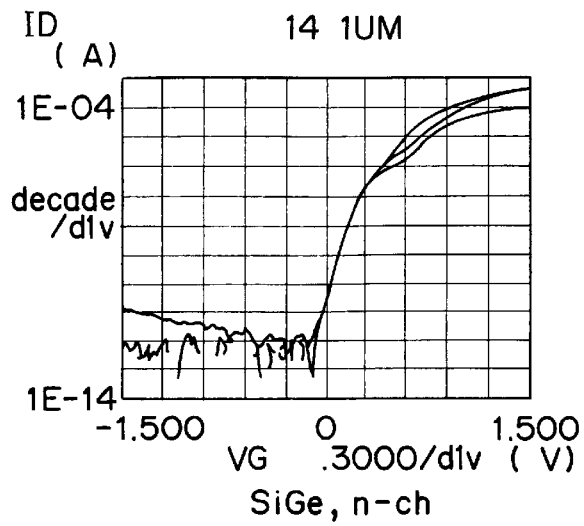
F I G. 4 B
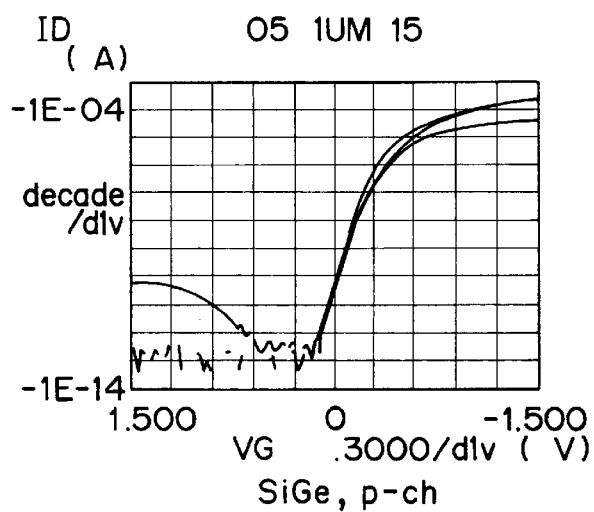
F I G. 4 C
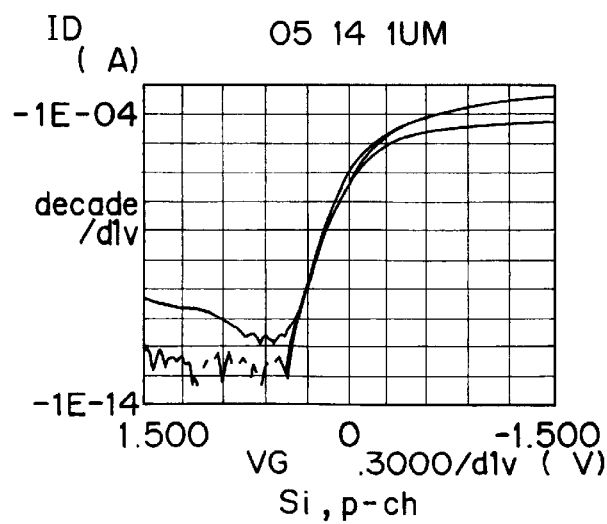

| GATE | TYPE | $V_{th}(V)$ | S(mV/dec) |
|------|------|-------------|-----------|
| SiGe | n-MOS | 0.5 | 64.3 |
| SiGe | p-MOS | -0.4 | 64.4 |
| Si | p-MOS | 0 | 65.4 |

SEMICONDUCTOR DEVICE WITH MOS TRANSISTORS SHARING ELECTRODE

RELATED APPLICATION DATA

The present application claims priority to Japanese Application No. P2000-375994 filed Dec. 11, 2000, which application is incorporated herein by reference to the extent permitted by law.

BACKGROUND OF THE INVENTION

The present invention relates to a semiconductor device including MOS transistors formed in thin film semiconductor regions and to a method of fabricating the semiconductor device.

Semiconductor devices such as LSIs (Large Scale Integrated Circuits) are each often formed on an Si chip, and are used for computers, communication terminals, and the like. Such a semiconductor device, however, is difficult to be formed on a large-sized Si chip, and if the semiconductor device can be formed on a large-sized Si chip, then the production cost thereof becomes high. A large-sized Si chip also has a disadvantage that the Si chip is not rigid and is thereby easily cracked. The recent development of semiconductor devices places emphasis on making device structures finer and lowering a voltage for operating devices. An operating speed of devices is also limited by an interconnection resistance, a junction capacitance, a channel depletion capacitance, and a heavily doped channel, and therefore, the operating speed of devices becomes closer to a critical value. To cope with such a problem, it would be expected to develop an LSI, which is aimed at improvement of interconnections and configured to include a transistor portion of an SOI (Silicon On Insulator) type having a thin film transistor (TFT) structure.

On the other hand, LCDs (Liquid Crystal Displays) of a type having polysilicon thin film transistors allowed to be integrated with scanning circuits have been commercially available. With respect to such an LCD, to enhance the function and enlarge the area, it has been required to produce a thin film transistor with higher mobility in both a scanning circuit and a peripheral circuit and with less variations in characteristics even with a fine device structure. The thin film transistor used for LCDs has been further required to have a circuit configuration coping with a reduced voltage and to have a system-on-panel structure in which a peripheral circuit is formed on the same substrate.

By the way, studies have been actively made to develop a gate material capable of operating a transistor at a low voltage and accurately controlling a threshold voltage. In particular, along with a tendency to form a semiconductor device on a substrate made from an inexpensive synthetic resin, a low temperature process including a step of forming a gate electrode has come to be required. In the recent technique of fabricating Si based LSIs, a polycrystalline silicon material is generally used as a gate electrode material.

In the case of forming a gate electrode of an MOS transistor by using polycrystalline silicon, however, there arises a problem. Since a concentration of an impurity doped in a channel region must be reduced, particularly, for realizing low voltage operation of the transistor, an nMOS transistor is depleted, thereby failing to obtain ideal operational characteristics of the transistor. The use of polycrystalline silicon causes another problem that polycrystalline silicon is not appropriate for a low temperature process using a low heat-resisting substrate such as a plastic material because of its high melting point.

As one countermeasure for solving such a technical problem, it has been known to use silicon-germanium (SiGe) as a gate electrode material. The use of silicon-germanium is advantageous in lowering an operational voltage as described, for example, in "Applications of Polycrystalline Silicon-Germanium Thin Films in Metal-Oxide-Semiconductor Technologies", Tsu-Jae King, Stanford Electronics Laboratories Technical Report No. ICL 94-031, 52–57 pp.

Even in the case of using, as a gate electrode material, silicon-germanium suitable for a low temperature process and effective to enhance operational characteristics of a transistor, however, if only the gate electrode material is changed to silicon-germanium with a related art device structure left as it is, the effect of using silicon-germanium is not sufficient in terms of a high speed operation and a high integration degree. Therefore, a semiconductor device using silicon-germanium as a gate electrode material would be expected to have a structure more suitable for a high speed operation and a high integration degree.

SUMMARY OF THE INVENTION

An object of the present invention is to provide a semiconductor device, which can be finely processed even by a low temperature process, and which can realize a low voltage operation and a high speed operation, and further a high integration degree, and to provide a method of fabricating the semiconductor device.

To achieve the above object, according to an aspect of the present invention, there is provided a semiconductor device including: a gate electrode made from silicon-germanium or germanium; a first semiconductor region formed under the gate electrode with a first gate insulating film between the first semiconductor region and the gate electrode; and a second semiconductor region formed over the gate electrode with a second gate insulating film between the second semiconductor region and the gate electrode, wherein a first conductivity type MOS transistor includes the first semiconductor region, the first gate insulating film, and the gate electrode, and a second conductivity type MOS transistor includes the second semiconductor region, the second gate insulating film, and the gate electrode.

With this configuration, since a first conductive type MOS transistor and a second conductive type MOS transistor are disposed on the upper and lower sides of a common gate electrode made from silicon-germanium or germanium, it is possible to improve the integration degree of the device and realize a high operational speed of the device.

According to another aspect of the present invention, there is provided a method of fabricating a semiconductor device, including the steps of: forming an insulating layer on a substrate; forming a first semiconductor region on the insulating layer; forming a first gate insulating film on the first semiconductor region; forming a gate electrode layer made from silicon-germanium or germanium on the first gate insulating film in such a manner as to be stacked on the first semiconductor region; activating the gate electrode layer; forming a second gate insulating film on the activated gate electrode layer; and forming a second semiconductor region on the second gate insulating film.

With this configuration, since a gate electrode layer made from silicon-germanium or germanium is formed on a gate insulating film in such a manner as to be stacked on a first semiconductor region and a second semiconductor region is formed on the gate electrode layer via a gate insulating film, it is possible to dispose MOS transistors on the upper and lower sides of the common gate electrode, and hence to increase the integration degree of the device.

BRIEF DESCRIPTION OF THE DRAWINGS

The above and other objects, features and advantages of the present invention will be apparent from the following detailed description of the preferred embodiments of the invention in conjunction with the accompanying drawings, in which:

FIGS. 4A to 4C are characteristic diagrams each showing a result of measuring a threshold voltage characteristic of an SOI type thin film transistor after furnace annealing, wherein FIG. 4A shows the threshold voltage characteristic of an nMOS transistor using an SiGe gate; FIG. 4B shows the threshold voltage characteristic of a pMOS transistor using an SiGe gate; and FIG. 4C shows the threshold voltage characteristic of an nMOS transistor using an Si gate;

FIGS. 8A to 8E are sectional views illustrating steps of fabricating a semiconductor device according to an embodiment of the present invention, wherein FIG. 8A shows steps until a step of forming a silicon layer; FIG. 8B shows steps until a step of activating an SiGe gate electrode layer; FIG. 8C shows steps until a step of patterning the SiGe gate electrode layer; FIG. 8D shows steps until a step of forming an upper silicon layer; and FIG. 8E shows steps until a step of forming an electrode layer;

DETAILED DESCRIPTION OF THE PREFERRED EMBODIMENTS

Hereinafter, preferred embodiments of the present invention will be described in detail with reference to the accompanying drawings.

A semiconductor device having a CMOS inverter according to this embodiment will be described with reference to FIGS. 1 to 7. It is to be noted that the semiconductor device having a CMOS structure to be described in this embodiment is applicable to various kinds of analog or digital circuits for a transfer gate, a switch, a sense amplifier, a buffer, an A/D converter, a differential amplifier, a shift register, a filter, a memory, and a flip-flop.

Figure 1:
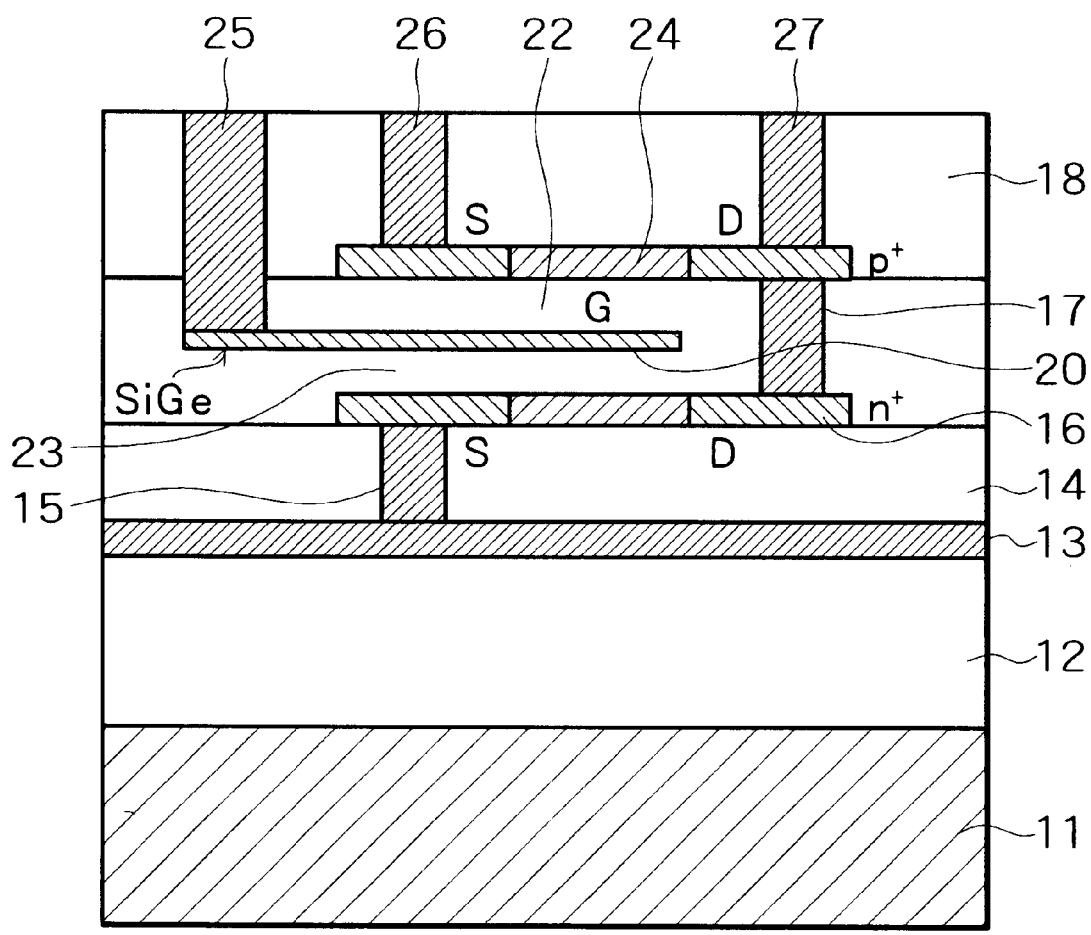
FIG. 1 is a sectional view of one embodiment of a semiconductor device of the present invention.

FIG. 1 shows a cross-sectional structure of a semiconductor device having a CMOS inverter according to this embodiment. This semiconductor device has a structure that a pair of upper and lower MOS transistors are formed on a low heat-resisting plastic substrate 11 via a buffer layer 12. The pair of MOS transistors are configured as an upper side pMOS transistor and a lower side nMOS transistor. These MOS transistors are controlled by a common SiGe gate electrode 20.

The plastic substrate 11 is made from a low heat-resisting organic polymer material. Examples of such organic polymer materials may include polyesters such as polyethylene terephthalate, polyethylene naphthalate, and polycarbonate; polyorefines such as polypropylene; polyphenylene sulfides such as polyphenylene sulfide; polyamides; aromatic polyamides; polyether ketones; polyimides; acrylic resins; and PMMA (polymethylmethacrylate). In particular, there is preferably used a general-purpose plastic material such as polyethylene terephthalate, polyacetate, polyphenylene sulfide, polycarbonate, polyether sulfone, polystyrene, nylon, polypropylene, polyvinyl chloride, acrylic resin, or PMMA. In the case of using the plastic substrate 11 in the form of a film, such a film is preferably a biaxial oriented film in terms of mechanical stability and mechanical strength. A barrier film such as a silicon oxide film for suppressing a hygroscopicity of the plastic substrate 11 may be formed on a back surface of the plastic substrate 11. This makes it possible to suppress deformation of the plastic substrate 11 when the plastic substrate 11 placed in a vacuum apparatus is exposed to atmospheric air and subjected to the subsequent process. It is more effective to form a barrier layer made from silicon oxide on a front surface of the plastic substrate 11.

A thermal buffer layer 12 is, preferably, previously formed on the plastic substrate 11. As the thermal buffer layer 12, a film made from an inorganic material such as SiO$_2$ or SiN$_x$ may be formed to a thickness of about 100 to 200 $\mu$m. In this case, to prevent peeling of the inorganic film at the time of irradiation of an energy beam due to a difference in thermal expansion between the organic polymer material forming the substrate 11 and the inorganic material forming the inorganic film, the buffer layer 12 is preferably configured to have a multi-layer structure that the inorganic film is further covered with a layer of an organic polymer material having a thermal softening point lower than that of the plastic substrate 11, for example, acrylic resin.

A ground voltage layer 13 for supplying a ground voltage to the nMOS transistor is formed on the buffer layer 12, and a silicon oxide layer 14 functioning as an insulating base of an SOI structure is formed on the ground voltage layer 13. A contact hole is formed in the silicon oxide layer 14 and is filled with a contact portion 15. A lower silicon layer 16 as a first semiconductor region is formed on the silicon oxide layer 14. The lower silicon layer 16 is connected to the ground voltage layer 13 via the contact portion 15.

The lower silicon layer 16 is a thin film semiconductor layer. More specifically, the lower silicon layer 16 may be a thin film type silicon layer having a so-called quasi-single crystal structure with equalized particle sizes and oriented plane orientations. The quasi-single crystal structure of the silicon layer can be obtained by irradiating the silicon layer with an energy beam such as an excimer laser beam. With respect to a thin film having such a quasi-single crystal structure, for example, Japanese Patent Laid-open No. Hei 11-145056 discloses a semiconductor thin film composed of nearly single crystal grains and a fabrication method thereof. The so-called quasi-single crystal structure is similar to a single crystal structure, that is, has a plurality of nearly single crystal grains made from a semiconductor. These crystal grains are preferentially oriented in one plane orientation. With respect to adjacent crystal grains thereof, a crystal lattice of one crystal grain is substantially matched with a crystal lattice of the adjacent crystal grain at least along part of a grain boundary therebetween. For example, by using a semiconductor thin film of quasi-single crystal oriented along a {100} plane, a circuit having a characteristic similar to that obtained by using a semiconductor thin film of single crystal formed on an insulating substrate can be formed on an arbitrary substrate made from glass, a metal, a ceramic material, or a plastic material at a low cost. Quasi-single crystal oriented along a {111} plane can be also used. As compared with the use of the above-described quasi-single crystal oriented along the {100} plane, the use of quasi-single crystal oriented along a {111} plane is advantageous in that the crystal lattice of each crystal grain is easy to be matched with the crystal lattice of the adjacent crystal grain along a grain boundary, and consequently a thin film device can be formed at an arbitrary position, and even if thin film devices are formed at various locations, the characteristics thereof can be equalized. The lower silicon layer 16 excluding a channel region opposed to the SiGe gate electrode 20 is heavily doped with an n-type impurity, whereby a source region (S) and a drain region (D) of the nMOS transistor are formed. A thickness of the lower silicon layer 16 is set to 40 nm but is not limited thereto.

A lower gate oxide film 23 as a gate insulating film is formed on the lower silicon layer 16. The lower gate oxide film 23 may be replaced with an oxide film combined with a nitride film. An SiGe gate electrode 20 made from silicon-germanium, which is capable of optimizing a Fermi level of the gate electrode 20 as will be described later, is formed on the lower gate oxide film 23. The SiGe gate electrode 20 is obtained by forming an SiGe layer doped with a p-type impurity such as boron by a sputtering process, activating the SiGe layer, and forming the SiGe layer into each fine rectangular shape having a specific gate length and a specific gate width by anisotropic etching such as RIE (Reactive Ion Etching). A thickness of the SiGe gate electrode 20 is typically set to about 60 nm. The SiGe gate electrode 20 is a layer made from silicon-germanium expressed by a general chemical formula of $Si_xGe_{1-x}$. As will be described later, a work function of the SiGe gate electrode 20 can be controlled by a content of germanium.

A silicon oxide film as an interlayer insulating film is formed around the SiGe gate electrode 20, and an upper gate oxide film 22 made from silicon oxide is formed on the SiGe gate electrode 20. The upper gate oxide film 22 is not limited to an oxide film but may be an oxide film combined with a nitride film. An upper silicon layer 24 as a second semiconductor region is formed on the upper gate oxide film 22. Like the lower silicon layer 16, the upper silicon layer 24 may be a silicon layer having the above-described quasi-single crystal structure with equalized particle sizes and oriented plane orientations. The quasi-single crystal structure of the silicon layer can be obtained by irradiating the silicon layer with an energy beam such as an excimer laser beam. The upper silicon layer 24 may be a silicon layer having the quasi-single crystal oriented along the {100} plane or the {111} plane. In this case, there can be obtained the above-described merit. The pMOS transistor side may sometimes function as a load element of a CMOS inverter configuration. In this case, the upper silicon layer 24 is not required to have the so-called quasi-single crystal structure but may be made from polycrystalline silicon with particle sizes becoming large or small by recrystallization. The upper silicon layer 24 excluding a portion opposed to the SiGe gate electrode 20 is heavily doped with a p-type impurity, to form a source region (S) and a drain region (D) of the pMOS transistor. A thickness of the upper silicon layer 24 is set to 40 nm but is not limited thereto. The upper silicon layer 24 is covered with a silicon oxide film 18.

The semiconductor device according to this embodiment, having the structure in which the nMOS transistor and the pMOS transistor are stacked, has a CMOS inverter structure. Accordingly, the source regions (S) of the nMOS transistor and the pMOS transistor are connected to the ground voltage layer 13 and a source voltage layer (not shown), respectively, and the drains regions (D) thereof are commonly connected to each other to be taken as an output terminal. To commonly connect both the drain regions (D) of the nMOS transistor and the pMOS transistor to each other, a through-hole is formed in the oxide film between the drain regions (D) of the upper and lower silicon layers 16 and 24, and a conductive material is buried in the through-hole, to form a contact region 17. An electrode extraction portion 27 is formed so as to extend from the drain region of the upper silicon layer 24 for extracting an output of the inverter. Similarly, an electrode extraction portion 26 is formed so as to extend from the source region of the upper silicon layer 24 on the pMOS side for connection to a source voltage side. Further, an electrode extraction portion 25 is formed so as to be connected to an end portion, out of the channel portion, of the SiGe gate electrode 20.

Figure 3:
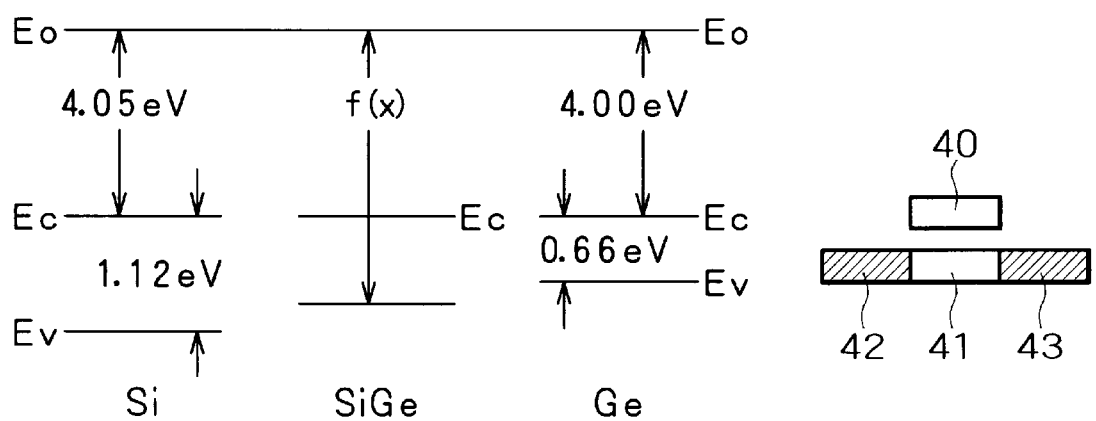
FIG. 3 is a diagram showing energy bands of silicon, silicon-germanium, and germanium.

In the semiconductor device having the CMOS structure according to this embodiment, the SiGe gate electrode 20 is a common gate electrode of both the pMOS transistor and the nMOS transistor, to exert an effect of electric field in the vertical direction perpendicular to a principal plane of the substrate with a single pattern, thereby controlling transport of carriers passing through the channel regions of the upper and lower silicon layers 16 and 24. Since the SiGe gate electrode 20 is the common gate of both the silicon layers 16 and 24 arranged in the vertical direction, it is possible to enhance the integration degree, and to connect the pMOS transistor and the nMOS transistor to each other only by a short contact region 17 extending in the vertical direction. With respect to the SiGe gate electrode 20 used as the common gate electrode, which is made from silicon-germanium, the Fermi level of the SiGe gate electrode 20 can be located at a position near the center of a band gap of silicon as shown in FIG. 3 by controlling a content of germanium, so that it is possible to obtain ideal operational characteristics of each of the nMOS transistor and the pMOS transistor even by using the same gate material therefor.

Figure 2:
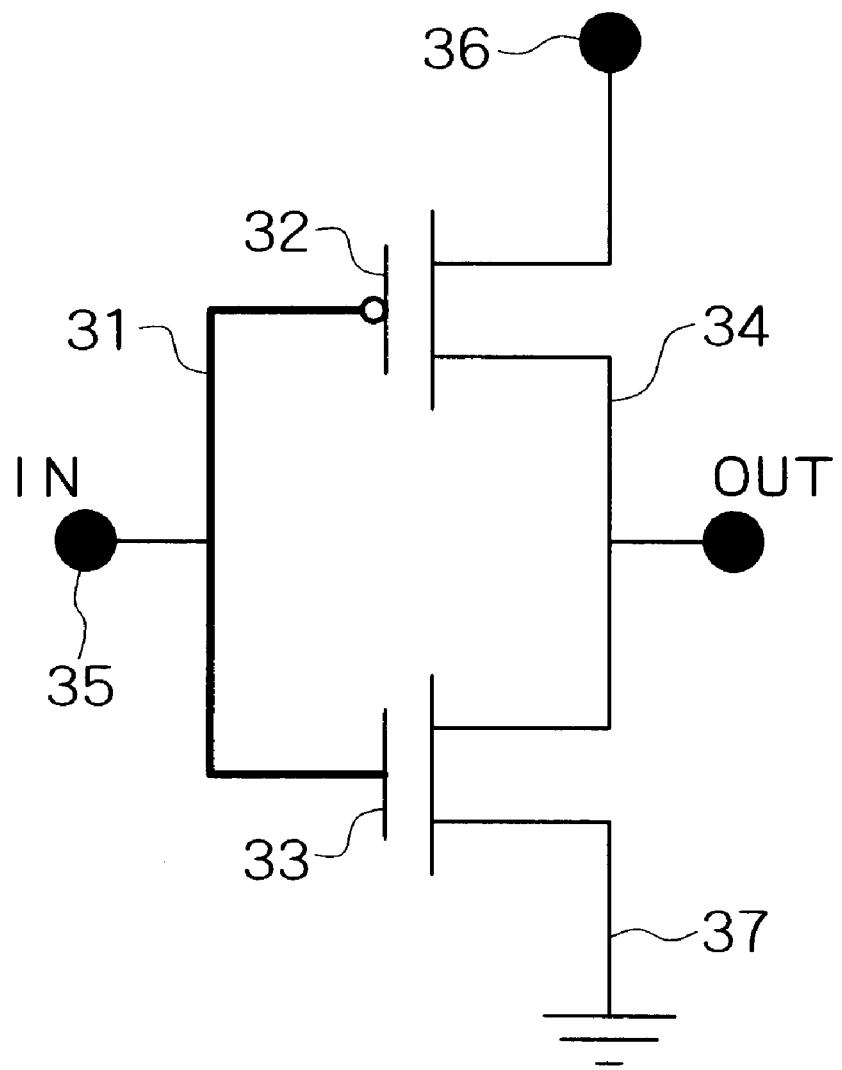
FIG. 2 is a circuit diagram of the semiconductor device shown in FIG. 1.

FIG. 2 is a circuit diagram of the semiconductor device having the CMOS structure according to this embodiment shown in FIG. 1. A pMOS transistor 32 and an nMOS transistor 33, whose drains are connected to each other into a common drain, are connected between a source voltage line 36 allowed to supply a low voltage and a ground voltage line 37. A source of the pMOS transistor 32 is connected to the source voltage line 36, and a source of the nMOS transistor 33 is connected to the ground voltage line 37. The common drain is connected to an output terminal 34, and a common gate electrode 31 made from SiGe is connected to an input terminal 35. According to the semiconductor device in this embodiment, as described above, the common gate electrode not only receives an electric signal common to both the pMOS transistor and the nMOS transistor, but also functions as the gate electrode of the pMOS transistor and the gate electrode of the nMOS transistor. To be more specific, the same p-type impurity doped silicon-germanium layer having the same work function acts on both the pMOS transistor and the nMOS transistor. Accordingly, a gate electrode of an nMOS transistor and a gate electrode of a pMOS transistor, which have been separately formed in the related art, can be perfectly formed at the same position by using the same material in accordance with the same production process, that is, perfectly formed as a common gate electrode. As a result, a semiconductor device having a CMOS structure fabricated according to this embodiment can realize a higher integration degree and a higher speed operation.

The characteristics of silicon-germanium will be described in detail with reference to FIGS. 3 to 7. FIG. 3 is a diagram showing band gaps of silicon (Si), silicon-germanium (SiGe), and germanium (Ge). As a result of comparison between silicon and germanium with reference to this figure, it is revealed that an energy level (Ec) of a conduction band (=4.05 eV) of silicon is only slightly different from an energy level (Ec) of a conduction band (=4.00 eV) of germanium; however, since an energy level (Ev) of a valence band of silicon is deeper than an energy level (Ev) of a valence band of germanium, an energy band gap (Ec-Ev) of silicon (=1.12 eV) becomes larger than an energy band gap (Ec-Ev) of germanium (=0.66 eV). In general, a work function of a material is determined by a difference between a free electron energy level and a Fermi level. On the other hand, the Fermi level of an n-type semiconductor is closer to a valence band, while the Fermi level of a p-type semiconductor is closer to a conduction band. As a result, even by increasing a content of germanium (Ge) in n-type impurity doped silicon-germanium (SiGe), the work function of the silicon-germanium (SiGe) is only slightly increased; however, by increasing a content of germanium (Ge) in p-type impurity doped silicon-germanium (SiGe), the work function of the silicon-germanium (SiGe) is significantly increased. Accordingly, by forming the p-type gate electrode 40 on the channel region 41 held between the source/drain regions 42 and 43 via the thin gate insulating film, the band gap and also the Fermi level of p-type silicon-germanium forming the gate electrode 40 are changed and thereby the work function thereof is correspondingly changed, depending on the content of germanium. For example, in the case of designing an inverter having a CMOS structure just as in this embodiment, it is important to shift the Fermi level of silicon-germanium to a position near the center of the band gap of silicon for the purpose of ensuring the symmetry of operational characteristics of the CMOS, and particularly, for the purpose of reducing an operational voltage. The control of the work function of silicon-germanium in the fabrication can be easily performed by adjusting the content of germanium to silicon, more specifically, adjusting a flow rate in the case of depositing silicon-germanium by CVD or adjusting a sputtering energy in the case of depositing silicon-germanium by sputtering.

FIGS. 4A, 4B and 4C are characteristic diagrams each showing a result of measuring a threshold voltage characteristic of an SOI type thin film transistor after furnace annealing, wherein FIG. 4A shows a threshold voltage characteristic of an nMOS transistor having an SiGe gate, FIG. 4B shows a threshold voltage characteristic of a pMOS transistor having an SiGe gate, and FIG. 4C shows a threshold voltage characteristic of an nMOS transistor having an Si gate. In these figures, the abscissa designates a gate voltage (VG) and the ordinate designates a drain current (ID).

As is apparent from FIGS. 4A and 4B, the threshold voltage characteristic of the nMOS transistor having the SiGe gate shown in FIG. 4A is significantly symmetric with the threshold voltage characteristic of the pMOS transistor having the SiGe gate shown in FIG. 4B. As a result, it would be expected to fabricate a high-speed operation inverter of a CMOS structure by using these MOS transistors. FIG. 4C shows the data of the pMOS transistor having the Si gate as reference. As is apparent from this figure, a large shift of the threshold voltage occurs on the pMOS transistor side depending on the work function of Si (silicon). Accordingly, a pMOS transistor having an SiGe gate as shown in FIG. 4B is superior to a pMOS transistor having an Si gate as shown in FIG. 4C in terms of symmetry with an nMOS transistor having an SiGe gate as shown in FIG. 4A, particularly, in particular, in order to reduce an operational voltage of an inverter having a CMOS structure composed of the nMOS transistor and the pMOS transistor.

Figures 5, 6:
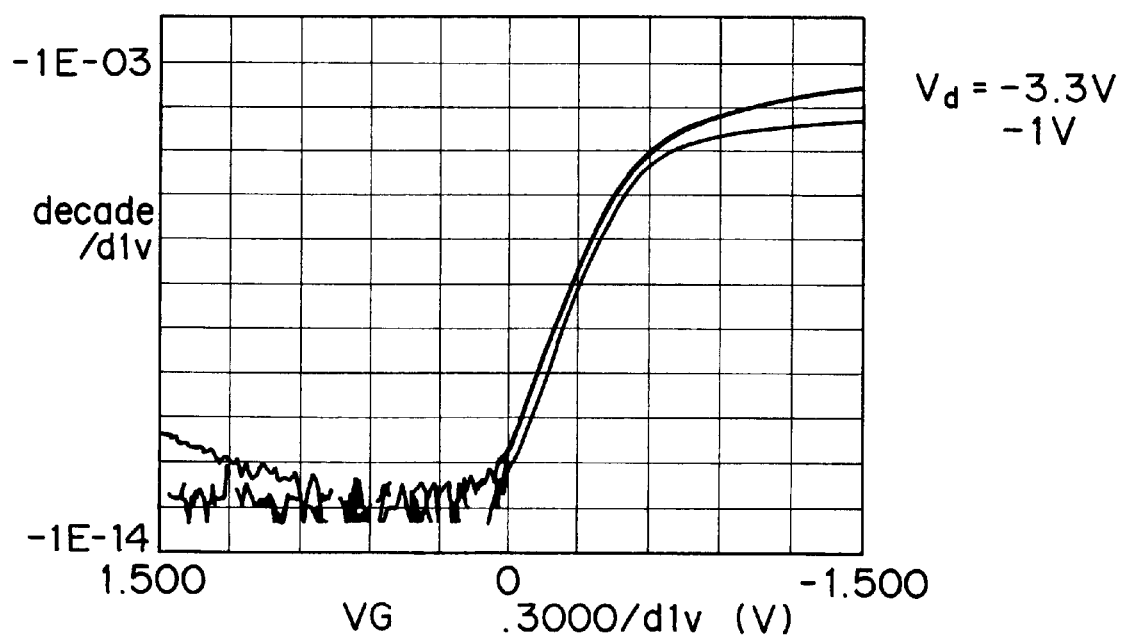
FIG. 5 is a table showing kinds of gates, MOS transistor types, and threshold voltage data for SOI type thin film transistors after furnace annealing.
FIG. 6 is a characteristic diagram showing a voltage-current characteristic of a p-channel SOI-TFT using a gate electrode made from silicon-germanium annealed by XeCl excimer laser.

FIG. 5 shows data of kinds of SOI type thin film transistors after furnace annealing, types of the MOS transistors, and threshold voltages. From the data shown in FIG. 5, it is revealed that the use of a gate made from p-type silicon-germanium can ensure a good symmetry in threshold voltage characteristic between a pMOS transistor and an nMOS transistor, and can control a threshold voltage while keeping a good transistor characteristic even at a low voltage. It is to be noted that data similar to those shown in FIG. 5 have been described in "Poly-crystallized SiGe thin films in a low-temperature process", Takashi Noguchi, Proceedings of POLYSE 2000 (Sep. 4, 2000, already published)

Such silicon-germanium is required to be activated after being deposited in order to be used as a conductive layer. The activation of silicon-germanium is performed by giving an activation energy thereto. For example, the activation of silicon-germanium is performed by furnace annealing or irradiating silicon-germanium with an energy beam such as an excimer laser beam. In particular, the annealing by an excimer laser beam makes it possible to activate silicon-germanium at a low temperature for a short time without exerting any thermal effect on an environment around silicon-germanium. FIG. 6 is a characteristic diagram showing a voltage-current characteristic of a p-channel SOI-TFT using a gate electrode made from silicon-germanium annealed by an XeCl excimer laser (wavelength: 308 nm). The gate electrode as a sample has a gate length of 1 $\mu$m and a gate width of 10 $\mu$m, and an oxide film has a thickness of 8 nm. It is to be noted that data similar to those shown in FIG. 6 have been described in the above document, "Poly-crystallized SiGe thin films in a low-temperature process", Takashi Noguchi, Proceedings of POLYSE 2000 (Sep. 4, 2000, already published). As compared with the activation of silicon-germanium by furnace annealing, the activation of silicon-germanium by excimer laser annealing (ELA) is advantageous in that a resistance value of silicon-germanium can be reduced. Another advantage of the activation of silicon-germanium by excimer laser annealing is that an irradiation energy amount can be finely controlled by changing the number of pulse shots or a pulse energy density. This is effective, particularly, in the case of forming a small-sized gate electrode.

Figure 7:
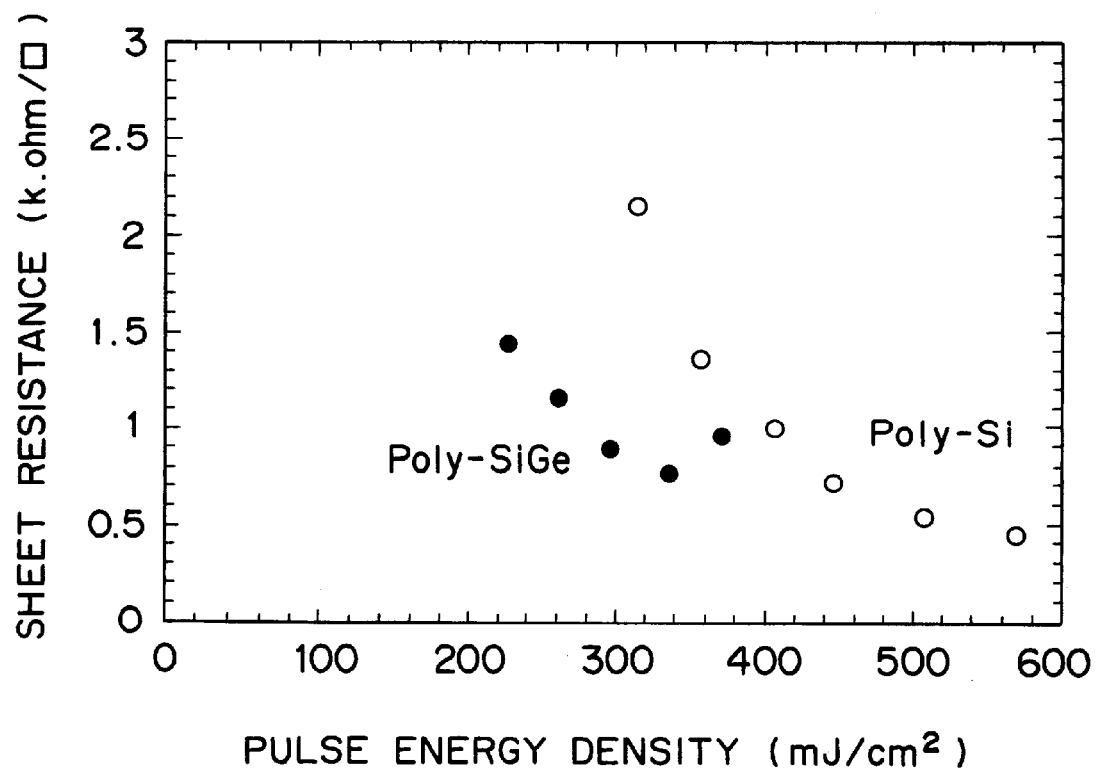
FIG. 7 is a characteristic diagram showing a relationship between a sheet resistance (k$\Omega$/□) and a pulse energy density (mJ/cm$^2$) of silicon-germanium after excimer laser annealing as compared with that of silicon after excimer laser annealing.

In the case of using silicon-germanium as a material of a gate electrode, the activation thereof by excimer laser annealing (ELA) is advantageous in that the energy for the activation of silicon-germanium can be suppressed. FIG. 7 is a characteristic diagram for comparing a relationship between a sheet resistance (kΩ/□) and a pulse energy density (mJ/cm$^2$) of silicon (Si) after excimer laser annealing with that of silicon-germanium (SiGe) after excimer laser annealing. In the figure, a closed circle designates a sheet resistance of polycrystalline silicon-germanium and an open circle designates a sheet resistance of polycrystalline silicon. As is apparent from the figure, even when a pulse energy density of an excimer laser beam used for irradiation is low, the resistance of polycrystalline silicon-germanium is lower than that of polycrystalline silicon. In other words, to obtain the same resistance value, silicon-germanium can be activated with a pulse energy density lower than that required for activation of silicon. That is to say, silicon-germanium can be activated at a lower temperature by excimer laser annealing. This means that the use of silicon-germanium is suitable for a low temperature process.

Silicon-germanium has a melting point lower than that of silicon, and is advantageously easy to reduce its resistance. As a result, the use of silicon-germanium is suitable for a low temperature process as compared with the use of silicon. Material characteristics of silicon and germanium are shown in Table 1.

TABLE 1

| Material Characteristic | Silicon | Germanium |
| --- | --- | --- |
| Lattice Constant (Å) | 5.431 | 5.646 |
| Density (g/cm$^3$) | 2.328 | 5.327 |
| Melting Point (° C.) | 1415 | 937 |
| Energy Gap (eV) | 1.12 | 0.66 |
| Mobility (drift) (cm$^2$/V-s) | | |
| Electron $\mu$n | 1500 | 3900 |
| Positive Hole $\mu$p | 450 | 1900 |
| Dielectric Constant | 11.9 | 16.0 |
| Resistivity (Ω-cm) | 2.3 × 10$^5$ | 47 |

As is apparent from Table 1, the melting point of silicon is as high as 1415° C., while the melting point of germanium is as low as 937° C. It is to be noted that these melting points, 1415° C. and 937° C. are obtained for bulk silicon and bulk germanium, respectively, and melting points of polycrystalline silicon and polycrystalline germanium are slightly lower than 1415° C. and 937° C., respectively. Anyway, using the mixture of germanium with silicon can realize a reduced melting point thereof, and therefore, the use of the mixture, that is, silicon-germanium as a gate material is advantageous for a low temperature process.

Figure 8A:
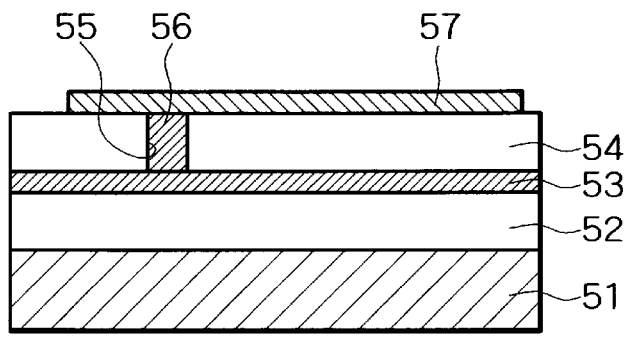

A method of fabricating a semiconductor device according to this embodiment will be hereinafter described with reference to FIGS. 8A to 8E. First, as shown in FIG. 8A, a plastic substrate 51 as a low-heat resisting substrate made from a synthetic resin is prepared, and a buffer layer 52 made from silicon oxide or silicon nitride is formed thereon. A ground voltage layer 53 made from polycrystalline silicon or a metal is formed on the buffer layer 52, and is then covered with a silicon oxide layer 54. A via-hole 55 is formed in the silicon oxide layer 54 at a specific position, and is buried with a contact portion 56. After formation of the contact portion 56, a thin film type lower silicon layer 57 is formed overall on the silicon oxide layer 54. The lower silicon layer 57 is a semiconductor layer which will be taken as a first semiconductor region, and is subjected to device isolation by anisotropic etching such as RIE. A thickness of the lower silicon layer 57 is typically set to 40 nm. The lower silicon layer 57 is preferably recrystallized by laser irradiation before or after device isolation. The lower silicon layer 57 may be heat-treated by laser irradiation so as to have a quasi-single crystal structure.

Figure 8B:
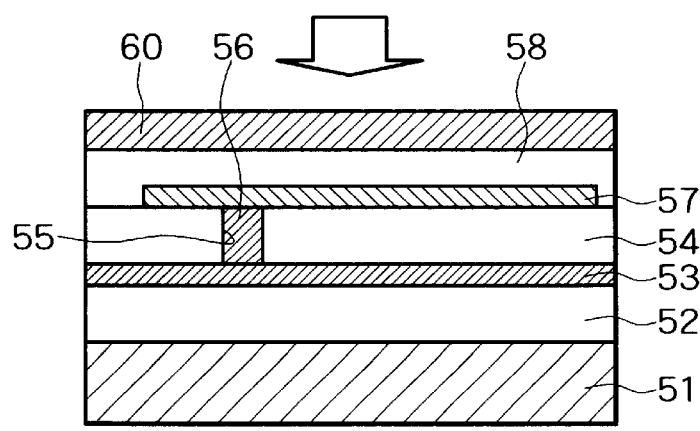

As shown in FIG. 8B, the lower silicon layer 57, which has been patterned into respective devices, is overall covered with a silicon oxide film 58. A portion, around a peripheral portion of the device, of the silicon oxide film 58 functions as an interlayer insulating film and a portion, over the lower silicon layer 57, of the silicon oxide film 58 functions as a gate oxide film. An SiGe electrode layer 60 made from silicon-germanium is formed overall on the silicon oxide film 58. The formation of the SiGe electrode layer 60 will be described below. A p-type amorphous silicon-germanium layer doped with a p-type impurity such as boron is deposited on the silicon oxide film 58 by sputtering or the like. A thickness of the amorphous SiGe electrode layer 60 made from silicon-germanium is typically set to about 60 nm. A work function of the p-type SiGe electrode layer 60 can be easily, certainly controlled by adjusting a content of germanium to silicon. For example, a MOS transistor having a specific threshold voltage set according to a desired circuit configuration can be formed by adjusting the content of germanium to silicon.

After formation of the SiGe electrode layer 60, the SiGe electrode layer 60 is activated by annealing. At this time, the SiGe electrode layer 60 is recrystallized so that a crystal structure of the SiGe electrode layer 60 is converted from the amorphous state to a polycrystalline state. The annealing is, as described above, performed by irradiating the SiGe electrode layer 60 with an energy beam. For example, the SiGe electrode layer 60 is annealed by excimer laser or rapid thermal annealing (RTA). In particular, the excimer laser annealing process makes it possible to anneal silicon-germanium at a low temperature for a short time without exerting thermal effect on an environment around silicon-germanium. As shown in Table 1, a melting point of silicon-germanium is lower than that of silicon, and as shown in FIG. 7, a sheet resistance of silicon-germanium can be reduced only by a low pulse energy of an excimer laser beam. Silicon-germanium, therefore, is suitable for a low temperature process.

Figure 8C:
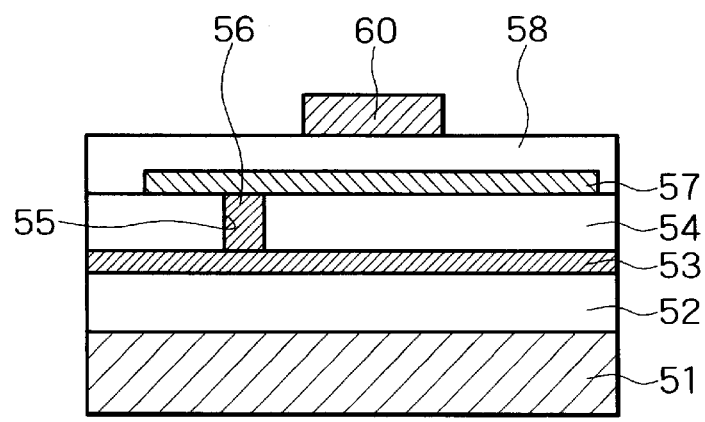

As shown in FIG. 8C, after activation of the SiGe electrode layer 60, the SiGe electrode layer 60 is finely processed into a specific pattern. A gate length is set to 0.2 $\mu$m but is not limited thereto. After patterning of the SiGe electrode layer 60, an n-type impurity is implanted in the lower silicon layer 57, to form source/drain regions (57sd). At this time, self-alignment anneal of the lower silicon layer 57 using the patterned SiGe electrode layer 60 as a mask is performed by RTA or excimer laser. In the case of using laser irradiation by excimer laser, the laser irradiation may be performed, for example, by a single shot at an energy density of 350 mJ/cm$^2$.

Figure 8D:
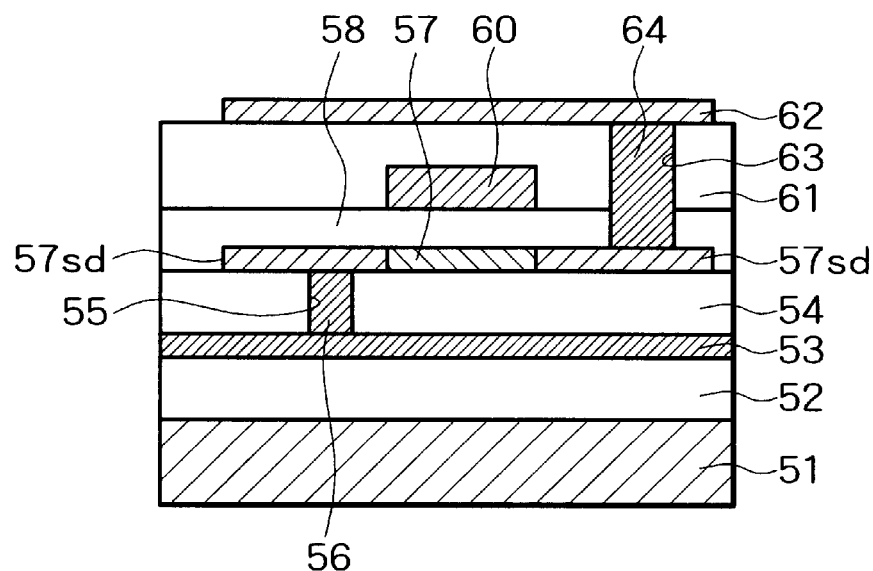

After formation of the source/drain regions (57sd) of the lower silicon layer 57, an interlayer insulating film is formed by a low temperature CVD or the like, followed by formation of a window to expose again a surface of the SiGe electrode layer 60, and a gate oxide film is formed thereon to a thickness of 10 nm by sputtering or the like. A via-hole 63 for common connection between the drains of a CMOS structure is formed and is then buried with a contact portion 64. A source/drain region 57sd formed in the lower silicon layer 57 is connected via the contact portion 64 to an upper silicon layer to be formed. After that, an amorphous silicon layer is formed overall to a thickness of about 40 nm by sputtering or the like, followed by anisotropic etching for device isolation, to form an upper silicon layer 62 similar to the lower silicon layer 57 as shown in FIG. 8D. The upper silicon layer 62 is preferably recrystallized by laser irradiation or heat-treated by laser irradiation so as to have a quasi-single crystal structure. In the case of using excimer laser, laser irradiation may be performed, for example, by 100 shots at an energy density of 370 mJ/cm$^3$.

Figure 8E:
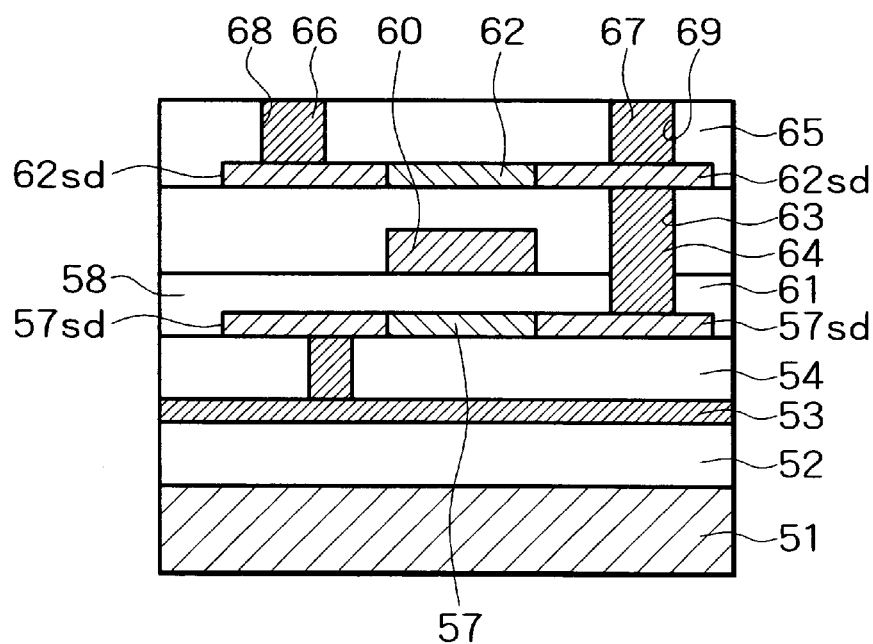

Subsequently, an insulating film as a mask is formed to a thickness of about 70 nm, and ions of a p-type impurity are heavily implanted in a region, other than a channel region, of the recrystallized upper silicon layer 62 by using the mask, to form a pMOS transistor having source/drain regions 62sd as shown in FIG. 8E. The source/drain regions 62sd can be activated by excimer laser annealing or the like. In the case of using laser irradiation by excimer laser, the laser irradiation may be performed, for example, by a single shot at an energy density of 300 mJ/cm$^2$. The excimer laser irradiation may be replaced with rapid thermal annealing (RTA). After the annealing, an interlayer insulating film 65 is formed on the entire surface, and contact windows 68 and 69 are formed in the interlayer insulating film 65. Electrodes 66 and 67 made from aluminum or the like are formed in the contact windows 68 and 69, respectively. A semiconductor device is thus obtained.

After that, if the semiconductor device is used for a liquid crystal display unit, then an ITO film or the like as a transparent electrode is formed. As described above, according to the method of fabricating a semiconductor device in this embodiment, since silicon-germanium is used as a gate material, the semiconductor device can be fabricated at a low temperature. To be more specific, the excimer laser annealing or the like can be used not only for activation of source/drains but also for activation of the SiGe gate material, so that it is possible to keep a low temperature process as a whole, and to use a low heat-resisting substrate such as a plastic substrate.

Figure 9:
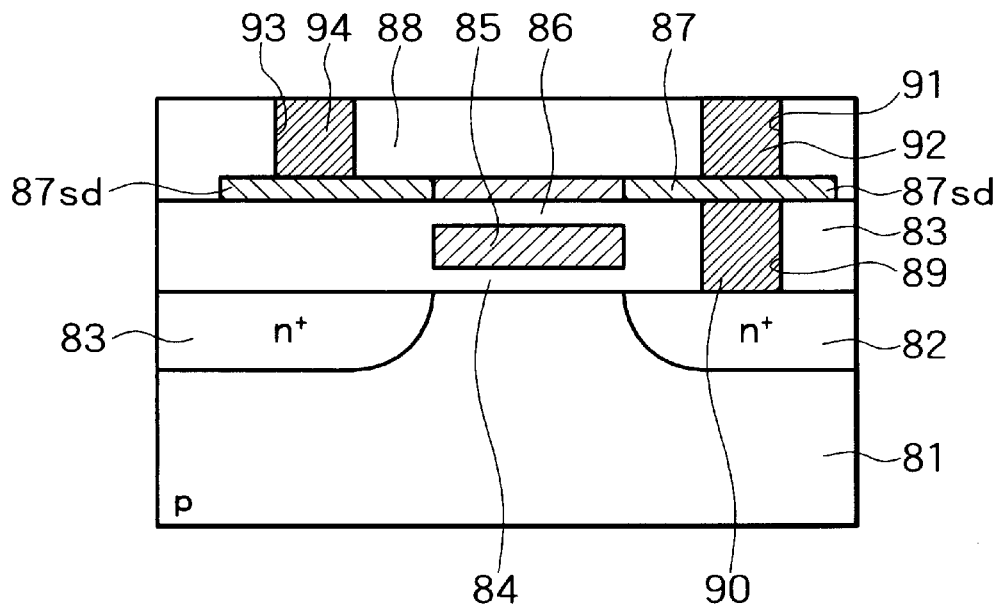
FIG. 9 is a sectional view showing another structure example of the semiconductor device of the present invention.

FIG. 9 shows another structure of the semiconductor device of the present invention. In this semiconductor device, a gate electrode composed of an SiGe electrode layer 85 is formed on a p-type silicon single crystal substrate 81 with a gate insulating film 84 therebetween, and source/drain regions 83 and 82 are formed in a surface portion of the p-type silicon single crystal substrate 81, to form a lower nMOS transistor. An upper silicon layer 87 is formed on the same SiGe electrode layer 85 (as a common electrode) with a gate insulating film 86 therebetween, and source/drain regions 87sd are formed on both end sides of the upper silicon layer 87, to form an upper pMOS transistor. A silicon oxide layer 88 as an interlayer insulating film is formed on the upper silicon layer 87, and contact holes 93 and 91 are formed in the silicon oxide layer 88 and are buried with extraction electrodes 94 and 92 for extracting electrodes of the thin film type upper pMOS transistor. One of the source/drain regions of the bulk nMOS transistor formed on the substrate side is connected to one of the source/drain regions 87sd of the thin film pMOS transistor via a contact portion 90 buried in a via-hole 89 passing through the interlayer insulating film 83.

Even for the structure in which the lower nMOS transistor is formed on the p-type silicon single crystal substrate 81 and the upper pMOS transistor is formed in the form of the thin film, the gate electrode made from silicon-germanium can be used as a gate electrode common to both the MOS transistor. As a result, it is possible to increase the integration degree of the semiconductor device, and to connect the pMOS transistor to the nMOS transistor only via a vertically extending short contact portion 90. Also the SiGe electrode layer 85 is used as the common gate electrode. Since the Fermi level of silicon-germanium forming the common gate electrode can be located at a position near the center of the band gap of silicon by controlling the content of germanium, the semiconductor device can obtain ideal operation characteristics although one gate electrode is used commonly to both the nMOS transistor and the pMOS transistor. Further, since the annealing of silicon-germanium can be performed by excimer laser, it is possible to keep a low temperature over the fabrication process, and to use a low heat-resisting substrate.

Figure 10:
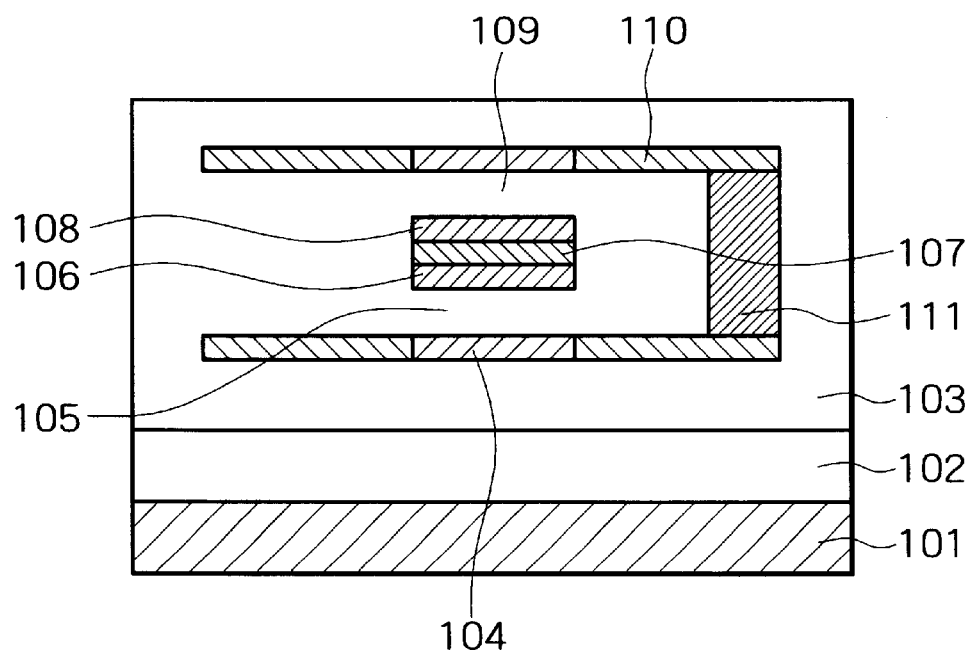
FIG. 10 is a sectional view showing a further structure example of the semiconductor device of the present invention.

FIG. 10 is a sectional view showing a further example of the semiconductor device of the present invention. In this semiconductor device, a buffer layer 102 is formed on a plastic substrate 101 as a low heat-resisting substrate, and an insulating film 103 is formed thereon. Subsequently, a lower silicon layer 104 is formed on the insulating film 103, and a gate insulating film 105 is formed on a channel region of the lower silicon layer 104. A gate electrode is formed on the gate insulating film 105. The gate electrode has a structure that an SiGe film 106, an Si film 107, and an SiGe film 108 are stacked in this order. The gate electrode having such a three-layer stacked structure is taken as a gate electrode common to a pMOS transistor and an nMOS transistor. An upper silicon layer 110 is formed on the SiGe film 108 via a gate insulating film 109, and source/drain regions are formed on both end sides of the upper silicon layer 110. One of the source/drain regions of the thin film type lower nMOS transistor formed on the substrate side is connected to one of the source/drain regions of the thin film type upper pMOS transistor via a contact portion 111 formed in a via hole passing through the insulating film 103.

Even in the case of using the gate electrode having the three-layer structure, like a gate electrode made from single silicon-germanium, the work function thereof can be controlled. More specifically, since the Fermi level of the three-layer gate electrode can be located at a position near the center of the band gap of silicon (see FIG. 3) by controlling the content of germanium, it is possible to realize ideal operational characteristics excellent in symmetry although the three-layer gate electrode is used commonly to both an nMOS transistor and a pMOS transistor. The content of germanium (Ge) of the SiGe film 108 may be adjusted so as to have a work function suitable for the upper MOS transistor, and the content of germanium (Ge) of the SiGe film 106 may be adjusted so as to have a work function suitable for the lower MOS transistor. Further, the content of germanium (Ge) may be gradually or stepwise changed from the upper side to the lower side of the common gate electrode, to obtain operational characteristics optimum to the nMOS transistor and operational characteristics optimum to the pMOS transistor.

Although silicon germanium ($Si_xGe_{1-x}$) is used as the material of the gate electrode in the above-described embodiment, single germanium with the content of silicon taken as substantially zero can be used. Also silicon-germanium may contain other impurities and other metal elements. For example, silicon-germanium-carbon containing carbon may be used. Further, according to the present invention, a gate insulating film of the MOS transistor is not limited to a silicon oxide film but may be another insulating film such as a silicon nitride film or a stacked layer of a silicon oxide film and a silicon nitride film.

As described above, according to the semiconductor device of the present invention, since a gate electrode made from silicon-germanium is taken as a gate electrode common to both a pMOS transistor an nMOS transistor arranged in the vertical direction, it is possible to increase the integration degree of the semiconductor device and to connect the pMOS transistor to the nMOS transistor only via a vertically extending short contact region. Since the Fermi level of silicon-germanium forming the common gate electrode can be located at a position near the center of the band gap of silicon (see FIG. 3) by controlling the content of germanium, the semiconductor device can obtain ideal operational characteristics, although the device uses a gate electrode common to the nMOS transistor and the pMOS transistor.

According to the semiconductor device of the present invention, since the melting point of the gate electrode made from silicon-germanium is low and the resistance thereof can be reduced with a low energy density, it is possible to fabricate the semiconductor device in accordance with a low temperature process, and to use a low heat-resisting substrate such as a plastic substrate.

While the preferred embodiments have been described using specific terms, such description is for illustrative purposes only, and it is to be understood that changes and variations may be made without departing from the spirit or scope of the following claims.

What is claimed is:

1. A semiconductor device comprising:
   a gate electrode made from silicon-germanium or germanium;
   a first semiconductor region formed under said gate electrode with a first gate insulating film between said first semiconductor region and said gate electrode; and
   a second semiconductor region formed over said gate electrode with a second gate insulating film between said second semiconductor region and said gate electrode,
   wherein a first conductivity type MOS transistor is comprised of said first semiconductor region, said first gate insulating film, and said gate electrode, and a second conductivity type MOS transistor is comprised of said second semiconductor region, said second gate insulating film, and said gate electrode.

2. A semiconductor device according to claim 1, wherein said first conductivity type MOS transistor is formed above a substrate.

3. A semiconductor device according to claim 2, wherein said substrate is a low heat-resisting substrate, and each of said first and second semiconductor regions is recrystallized by irradiation of an energy beam.

4. A semiconductor device according to claim 1, wherein said first semiconductor region is a semiconductor layer comprised in part of a single crystal semiconductor substrate or an insulator, and said second semiconductor region is a semiconductor layer.

5. A semiconductor device according to claim 1, wherein said gate electrode is doped with a p-type impurity.

6. A semiconductor device according to claim 1, wherein said gate electrode is common to said first conductivity type MOS transistor and said second conductivity type MOS transistor, and a drain region of said first conductivity type MOS transistor is electrically connected to a drain region of said second conductivity type MOS transistor.

7. A semiconductor device according to claim 6, wherein said first conductivity type MOS transistor and said second conductivity type MOS transistor form a CMOS inverter.

8. A semiconductor device comprising:
   a first conductivity type MOS transistor and a second conductivity type MOS transistor, which are stacked on the same substrate,
   wherein,
      a gate electrode common to said first and second conductivity type MOS transistors is made from silicon-germanium, and
      a content of germanium to silicon in said silicon-germanium is set to optimize a work function of said gate electrode.

9. A semiconductor device according to claim 8, wherein a Fermi level of said silicon-germanium forming said gate electrode is located at a position near a center of a band gap of a silicon material.

10. A semiconductor device comprising:
    a gate electrode;
    a first semiconductor region formed under said gate electrode with a first gate insulating film between said first semiconductor region and said gate electrode; and
    a second semiconductor region formed over said gate electrode with a second gate insulating film between said second semiconductor region and said gate electrode,
    wherein,
       a first conductivity type MOS transistor is comprised of said first semiconductor region, said first gate insulating film, and said gate electrode, and a second conductivity type MOS transistor is comprised of said second semiconductor region, said second gate insulating film, and said gate electrode, and
       said gate electrode has a stacked structure of a silicon-germanium layer or a germanium layer, a silicon layer, and a silicon-germanium layer or a germanium layer.

11. A semiconductor device comprising:
    a single gate electrode; and
    a first semiconductor region and a second semiconductor region adjacently formed on both sides of said single gate electrode with gate insulating films between the gate electrode and the first and second semiconductor regions,
    wherein, a first conductivity type MOS transistor is comprised of said first semiconductor region, said gate insulating film, and said single gate electrode, and a second conductivity type MOS transistor is comprised of said second semiconductor region, said gate insulating film, and said single gate electrode, and
    said single gate electrode comprises germanium or silicon germanium.

12. A method of fabricating a semiconductor device, comprising the steps of:
    forming an insulating layer on a substrate;
    forming a first semiconductor region on said insulating layer;
    forming a first gate insulating film on said first semiconductor region;
    forming a gate electrode layer made from silicon-germanium or germanium on said first gate insulating film in such a manner as to be stacked on said first semiconductor region;
    activating said gate electrode layer;
    forming a second gate insulating film on said activated gate electrode layer; and
    forming a second semiconductor region on said second gate insulating film.

13. A method of fabricating a semiconductor device according to claim 12, wherein the activation of said gate electrode layer is performed by irradiation of an energy beam.

14. A method of fabricating a semiconductor device according to claim 13, wherein the irradiation of said energy beam is performed by irradiation of an excimer laser beam, and an irradiation energy density of said excimer laser beam is in a range of 350 mJ/cm$^2$ or less.

* * * * *